(12) United States Patent
Zandbergen et al.

(10) Patent No.: US 7,897,324 B2
(45) Date of Patent: *Mar. 1, 2011

(54) LITHOGRAPHIC METHOD

(75) Inventors: Peter Zandbergen, Hechtel-Eksel (BE);
Jeroen H Lammers, Eindhoven (NL);
David Van Steenwinckel, Holsbeek (BE)

(73) Assignee: NXP B.V., Eindhoven (NL)

( * ) Notice: Subject to any disclaimer, the term of this patent is extended or adjusted under 35 U.S.C. 154(b) by 3 days.

This patent is subject to a terminal disclaimer.

(21) Appl. No.: 12/065,926

(22) PCT Filed: Sep. 5, 2006

(86) PCT No.: PCT/IB2006/053116

§ 371 (c)(1),
(2), (4) Date: Mar. 6, 2008

(87) PCT Pub. No.: WO2007/029176

PCT Pub. Date: Mar. 15, 2007

(65) Prior Publication Data

US 2008/0241764 A1    Oct. 2, 2008

(30) Foreign Application Priority Data

Sep. 6, 2005    (EP) .................................. 05108163

(51) Int. Cl.
*G03F 7/40*    (2006.01)
*G03F 1/00*    (2006.01)

(52) U.S. Cl. ..................... 430/325; 430/322; 430/330

(58) Field of Classification Search ................ None
See application file for complete search history.

(56) References Cited

U.S. PATENT DOCUMENTS

| 5,178,989 | A  | * | 1/1993  | Heller et al. ................. 430/323 |
| 5,968,712 | A  |   | 10/1999 | Thackeray et al. |
| 6,153,349 | A  | * | 11/2000 | Ichikawa et al. ............ 430/170 |
| 6,338,934 | B1 |   | 1/2002  | Chen et al. |
| 6,495,307 | B2 |   | 12/2002 | Yasunori et al. |
| 6,534,243 | B1 |   | 3/2003  | Templeton et al. |
| 6,780,569 | B1 |   | 8/2004  | Hudson et al. |
| 6,787,283 | B1 |   | 9/2004  | Aoai et al. |
| 2001/0046641 | A1 | * | 11/2001 | Uetani et al. ............. 430/270.1 |
| 2003/0031956 | A1 |   | 2/2003  | Wijnaendts et al. |
| 2003/0175620 | A1 |   | 9/2003  | Toishi et al. |

FOREIGN PATENT DOCUMENTS

| EP | 0558280 A1 | 9/1993 |
| EP | 0660187 A1 | 6/1995 |

* cited by examiner

*Primary Examiner*—Daborah Chacko Davis

(57) ABSTRACT

The present invention provides a method of lithographic patterning in order to the strength of the patterned photoresist. The method comprises: applying to a surface to be patterned a photoresist (18) comprising a polymer resin, a photocatalyst generator which generates a catalyst on exposure to actinic radiation, and a quencher; and exposing the photoresist (18) to actinic radiation through a mask pattern (12). This is followed, in either order, by carrying out a post-exposure bake; and developing the photoresist (18) with a developer to remove a portion of the photoresist which has been exposed to the actinic radiation. The polymer resin is substantially insoluble in the developer prior to exposure to actinic radiation and rendered soluble in the developer by the action of the catalyst, and wherein the polymer resin is crosslinked by the action of the quencher during the bake.

15 Claims, 1 Drawing Sheet

LITHOGRAPHIC METHOD

Figure 1:
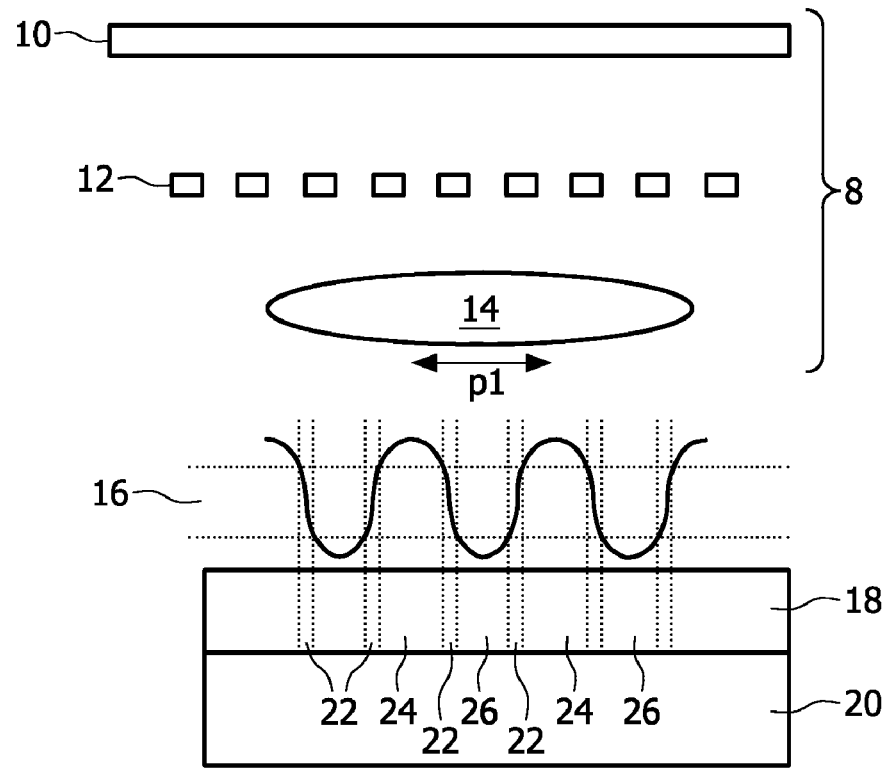

This invention relates to a lithographic method, and particularly to a lithographic method suitable for improving the strength of the patterned photoresist.

Optical lithography is most commonly used to pattern semiconductors, since the fine details achievable using modern optical lithography systems are well suited to semiconductor manufacture. However, the approach can be used in other technology fields as well, including nanotechnology, the manufacture of diffraction gratings, or indeed any field in which fine patterns are required.

In conventional optical lithography, the patterning may be achieved by the illumination of a radiation-sensitive film (a photoresist) through an intervening patterned mask. Exposure to the light causes a chemical reaction which renders the photoresist more or less soluble in a particular solvent (developer). The more soluble areas of the photoresist are removed by treating the exposed photoresist with the developer. The photoresist may be a so-called positive or negative photoresist. In a positive photoresist the initially unexposed photosensitive film is essentially insoluble in the developer and becomes soluble if the exposure to actinic radiation is above a threshold value. Conversely, a negative photoresist, the initially unexposed photosensitive film is soluble in the developer and becomes essentially insoluble if the exposure to light is above a threshold value.

In a positive photoresist, development of the exposed photoresist with the developer dissolves the exposed portion of the photoresist to provide lines and spaces. Patterning of the substrate can then proceed in the usual way by etching, ion implanting or otherwise treating the surface of the substrate. However, the further treatment of the substrate invariably involves the use of harsh chemicals and other techniques which can degrade the photoresist. This is particularly problematic with the present demands, particularly in the semiconductor industry, for thinner photoresists.

U.S. Pat. No. 6,780,569 discloses a lithographic method used in the fabrication of a semiconductor device in order to increase the strength of the patterned photoresist. The photoresist is patterned in the usual manner and subsequently the device is exposed to a reactive gas in order to crosslink the patterned polymer resin. However, this process requires additional steps in the fabrication which adds to the complexity and cost, particularly since the device has to be held in a gas chamber for the crosslinking step to be performed.

There thus remains a need for a convenient method which increases the strength of the photoresist and hence reduces the degradation of the photoresist in subsequent processing steps.

According to the present invention there is provided a method of lithographic patterning, comprising: applying to a surface to be patterned a photoresist comprising a polymer resin, a photocatalyst generator which generates a catalyst on exposure to actinic radiation, and a quencher; and exposing the photoresist to actinic radiation through a mask pattern; followed, in either order, by carrying out a post-exposure bake; and developing the photoresist with a developer to remove a portion of the photoresist which has been exposed to the actinic radiation; wherein the polymer resin is substantially insoluble in the developer prior to exposure to actinic radiation and rendered soluble in the developer by the action of the catalyst, and wherein the polymer resin is crosslinked by the action of the quencher during the bake.

The method according to the present invention provides a chemically and physically strengthened resist with the advantage that it provides such a resist without any additional processing steps, i.e. using only the conventional processing steps of applying the photoresist to the substrate, exposing the photoresist to actinic radiation, and then developing and baking the photoresist.

Figure 2:
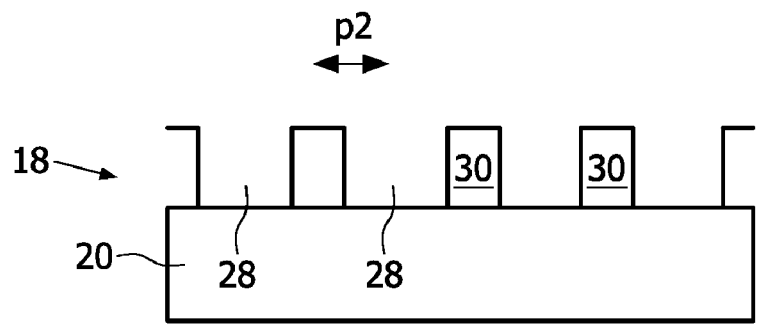

For a better understanding of the invention, an example will now be described, purely by way of example, with reference to the accompanying drawings, in which:

FIG. 1 shows the exposure of the photoresist according to the present invention; and FIG. 2 shows the photoresist after development according to the present invention.

As shown schematically in FIG. 1, an optical system 8 includes a diffuse source of light 10, a mask 12 and an optical imaging system 14 here represented by a lens. As the skilled person will appreciate, the imaging system will in practice be more complicated than represented here but these additional details are well known in the art and so will not be presented further.

The optical system creates a pattern of light 16 across the surface of the photoresist 18 on substrate 20, here a semiconductor substrate 20. The exposure varies essentially sinusoidally across the substrate caused by the first order image of the mask 12, which here consists of regularly spaced lines. The intensity varies sinusoidally across the surface with a pitch $p_1$.

The exposure thus creates areas of high exposure 24 in which the exposure is above first threshold, areas of low exposure 26 in which the exposure is below a second threshold, and areas of intermediate exposure 22 between the areas of high and low exposure 24,26.

The photoresist 18 contains a photocatalyst generator which generates a catalyst on exposure to actinic radiation. However, no catalyst is generated in areas which are not exposed to actinic radiation. The photocatalyst generator may be a photoacid generator which generates an acid on exposure to actinic radiation or a photobase generator which generates a base on exposure to actinic radiation. Photoacid generators and photobase generators are well known in the art. Preferred photoacid generators include aromatic substituted halohydrocarbons, halo-substituted sulphur-containing compounds, haloheterocyclic compounds, onium salts, sulfonated esters and sulfonated ketones. Further examples are disclosed in U.S. Pat. No. 6,534,243. The photocatalyst generator is preferably present at 0.5-30%, more preferably 1-10% and most preferably about 5% by weight based on the total weight of the photoresist 18.

After exposure, the semiconductor substrate 20 and photoresist 18 are treated to a post-exposure bake, for example at 100-160° C., preferably 110-130° C., particularly preferably about 120° C. for about 1-2 mins, preferably about 90 s. At this temperature, a chemical reaction catalysed by the photogenerated catalyst takes place which modifies the solubility of the photoresist 18, typically an acid-catalysed chemical reaction in which hydrophobic groups are removed from the polymer backbone to yield hydrophilic groups. This reaction may be, for example, an acid-catalysed hydrolysis of a carboxylic acid derivative to yield a carboxylic acid group.

The extent that this reaction takes place depends on the degree of exposure to actinic radiation. Thus, in regions 24 of high exposure, the reaction takes place to a large extent leaving the photoresist substantially soluble, e.g. hydrophilic. In regions 26 of low exposure, the reaction takes place to a small extent leaving the photoresist substantially insoluble, e.g. hydrophobic.

This is the step reached shown in FIG. 1.

The samples are then developed using a developer, although development may in some instances precede post-exposure baking. The developer dissolves the exposed portion of the photoresist, as shown in FIG. 2 to provide lines and spaces. Developing solvents are known in the art although the nature of the solvent will depend on the nature of the polymer resin used in the photoresist 18. Where the polymer resin has protected carboxylic acids as the functional groups, the developer is typically an aqueous solution of 0.26N TMAH (tetramethyl ammonium hydroxide). For good results, the dissolution process during development should be thermodynamically favourable as well as kinetically rapid. The speed of reaction is best determined by experiment. Thermodynamics does however allow some determinations of suitable solvents. In practice therefore experiment may represent a good way to determine suitable combinations of developer and photoresist.

Patterning of the substrate 20 can then proceed in the usual way by etching, ion implanting or otherwise treating the surface of the substrate.

In order to enhance the contrast between areas 24 where the catalyst is generated and areas 26 where the catalyst is not generated, a quencher is typically incorporated into the photoresist. Quencher loading is in the region of 5-20% by weight, preferably about 10% by weight based on the total weight of the photocatalyst prior to exposure, i.e. the photocatalyst loading. The photo-generated catalyst is thereby neutralised by the quencher in areas of low exposure and to some extent in areas of intermediate light exposure. In areas where there is no light exposure, there is no catalyst generation and hence no reaction between the catalyst and the quencher. In areas of high exposure, the amount of quencher incorporated into the photoresist 18 is necessarily insufficient to neutralise the photo-generated catalyst and hence the photo-generated catalyst is able to perform its function of catalysing the modification in the solubility of the polymer resin.

Where a photoacid generator is used, an acid will be generated. In such a case, the quencher will necessarily be basic, i.e. capable of reacting with the acid to neutralise the acid. Quenchers are also well known in the art. The quencher is preferably an aqueous base quencher. Examples of basic quenchers are amines, such as tributylamine and tetrabutylammonium hydroxide.

Thus, a typical photoresist 18 for use in lithography comprises a polymer resin, a photocatalyst generator which generates a catalyst on exposure to actinic radiation, and a quencher. The present invention results from the realisation that the excess quencher may be used to cure (crosslink) the photoresin 18 by using a resin which reacts with the quencher on heating, so-called dark area crosslinking, providing increased chemical and physical resistance to the photoresist in subsequent processing steps.

As well as being substantially insoluble in the developer prior to exposure to actinic radiation and soluble in the developer by the action of the catalyst—which is a standard property of polymer resins used in the art, the polymer resin used in the present invention must also be capable of crosslinking by the action of the quencher during heating at baking temperatures, e.g. 100-160° C., preferably 110-130° C., particularly preferably 120° C. That is, the polymer resin undergoes thermally activated crosslinking in the presence of the quencher. The polymer resin does not therefore crosslink in the presence of the quencher prior to heating. These two functions of the polymer resin may be achieved by incorporating a polymer having functional groups which render the polymer substantially insoluble in the developer but become soluble in the developer by the action of the catalyst as well as functional groups capable of crosslinking the polymer by the action of the quencher during heating. Alternatively the two functions may be achieved by incorporating two polymers each having one or other of the above-defined functional groups. The same functional groups may also perform both functions. The chemical nature of the polymer resin will depend on the chemical nature of the quencher and vice versa. However, crosslinking reaction of functional groups catalysed by, for example, acid or base are well known.

The polymer preferably has back bone and plurality of hydrophobic groups which become hydrophilic on exposure to the catalyst, more preferably protected carboxylic acid groups and most preferably ester or acid anhydride groups. Such groups become hydrophilic in the presence of acid and also undergo thermally activated crosslinking in the presence of a di- (or multi-) functional base, i.e. a quencher having two or more basic functional groups per molecule.

By way of example, the polymer resin may be a poly (methyl)methacrylate-based polymer, e.g. a copolymer of 2-methyl-2-adamantyl-methacrylate with mevalonic lactone methacrylate, or a cycloolefin maleic anhydride, e.g. a copolymer of the monomers t-butyl-5-norbornene-2-carboxylate, 5-norbornene-2-carboxylic acid and 2-hydroxyethyl-5-norbornene-2-carboxylate. Both types of polymers undergo crosslinking by heating in the presence of a diamine, more specifically a compound having the general formula $H_2N\text{-}A\text{-}NH_2$, where A represents a divalent $C_{3-10}$ alkyl, $C_{5-6}$ cycloalkyl or $C_{6-10}$ aryl. Without wishing to be bound by theory, it is thought that the amino functionality on the quencher reacts with the ester in the poly(methyl)methacrylate-based polymer or the acid anhydride in the cycloolefin maleic anhydride to crosslink the polymers. The amino functionality in the diamine also provides the necessary basicity in the quencher to quench a photo-generated acid during the expose phase of the lithographic process. The diamine is required to have a sufficiently low volatility that it remains in the photoresist during baking. Preferably the diamine has a boiling point above the baking temperature.

Another crosslinking reaction which may be utilised is the base-catalysed crosslinking of carboxy and epoxy functional groups which occurs at a significant rate by thermal treatment. Suitable bases include tertiary amines. The base-catalysed crosslinking of polyol-isocyanate may also be used, for example in the presence of diazabicyclo octane or diazabicyclo nonene.

Further examples of crosslinking chemistry which may be used in the present invention include polymers incorporating aldehyde functionality which form hemiacetals, acid anhydrides and mixed anhydrides, e.g. succinic and acetic anhydride, thiols, epichlorohydrin and other epoxide functionalities, triphosphate functionality, divinyl sulphone functionality and epoxy polymers formed by the crosslinking of diglycidyl ether of bisphenol-A (DGEBA) with maleic anhydride.

Other standard components may be added to the photoresist 18, such as a light-absorbing dye, levelling agents (surfactants) and dissolution inhibitors. The formulation also includes the solvent in which the polymer is dissolved in order to carry out the spin coating process.

In an embodiment of the present invention a photoresist containing a copolymer of 2-methyl-2-adamantyl-methacrylate with mevalonic lactone methacrylate, tri-phenyl sulfonium nonaflate (tPS—Nf) as the photoacid generator and 1,10-diaminodecane (bp 140° C.) may be deposited to a thickness of 280 nm on a substrate of silicon oxynitride (SiON) on silicon. An optical signal is used to expose the photoresist with a repeating pattern of period 360 nm across the substrate. A post exposure bake of 90 s at 120° C. is then applied to crosslink the polymer. Aqueous 0.26N TMAH is then used as a developer, the exposed sample being placed in the developer for a period of 60 s at room temperature (22° C.).

This development step dissolves regions of photoresist that are exposed with a dose from 0.9 arbitrary units (a.u.) to 2.2 a.u. Regions with higher or lower doses are dissolved at a much lower rate. An electron micrograph may be taken to show a pattern in the resist across the substrate.

The invention claimed is:

1. A method of lithographic patterning, comprising:
applying to a surface to be patterned a photoresist comprising a polymer resin, a photocatalyst generator which generates a catalyst on exposure to actinic radiation, and a quencher, wherein the quencher comprises 11-20% of the photoresist by weight; and
exposing the photoresist to actinic radiation through a mask pattern; followed, in either order, by carrying out a post-exposure bake; and
developing the photoresist with a developer to remove a portion of the photoresist which has been exposed to the actinic radiation;
wherein the polymer resin is substantially insoluble in the developer prior to exposure to actinic radiation and rendered soluble in the developer by the action of the catalyst, and wherein the polymer resin is crosslinked by the action of the quencher during the bake.

2. A method according to claim 1, wherein the photocatalyst generator is a photoacid generator which generates an acid on exposure to actinic radiation.

3. A method according to claim 1, wherein the polymer resin comprises a polymer having back bone and plurality of protected carboxylic acid groups.

4. A method according to claim 3, wherein the protected carboxylic acid groups are ester or acid anhydride groups.

5. A method according to claim 4, wherein the polymer resin comprises a poly(methyl)methacrylate-based polymer or a cycloolefin maleic anhydride.

6. A method according to claim 1, further comprising a hard bake after the post-exposure bake and developing.

7. A method according to claim 1, wherein the bake is performed at a bake temperature and wherein the quencher has a boiling point above the bake temperature.

8. A method of lithographic patterning, comprising:
applying to a surface to be patterned a photoresist comprising a polymer resin, a photocatalyst generator which generates a catalyst on exposure to actinic radiation, and a quencher, wherein the quencher comprises 11-20% of the photoresist by weight and wherein the polymer resin reacts with the quencher on heating and undergoes thermally activated crosslinking; and
exposing the photoresist to actinic radiation through a mask pattern; followed, in either order, by carrying out a post-exposure bake; and
developing the photoresist with a developer to remove a portion of the photoresist which has been exposed to the actinic radiation;
wherein the polymer resin is substantially insoluble in the developer prior to exposure to actinic radiation and rendered soluble in the developer by the action of the catalyst, and wherein the polymer resin is crosslinked by the action of the quencher during the bake.

9. A method according to claim 8, wherein excess quencher is used to crosslink the photoresist during the bake.

10. A method according to claim 9, wherein the bake is performed at a bake temperature and wherein the quencher has a boiling point above the bake temperature.

11. A method according to claim 8, wherein the photocatalyst generator is a photoacid generator which generates an acid on exposure to actinic radiation.

12. A method according to claim 8, wherein the polymer resin comprises a polymer having back bone and plurality of protected carboxylic acid groups.

13. A method according to claim 12, wherein the protected carboxylic acid groups are ester or acid anhydride groups.

14. A method according to claim 13, wherein the polymer resin comprises a poly(methyl)methacrylate-based polymer or a cycloolefin maleic anhydride.

15. A method according to claim 8, further comprising a hard bake after the post-exposure bake and developing.

* * * * *